US008385378B2

(12) United States Patent
Vurgaftman et al.

(10) Patent No.: US 8,385,378 B2
(45) Date of Patent: Feb. 26, 2013

(54) INTERBAND CASCADE LASERS (75) Inventors: Igor Vurgaftman, Odenton, MD (US); Jerry R. Meyer, Catonsville, MD (US); Chadwick Lawrence Canedy, Washington, DC (US); William W. Bewley, Falls Church, VA (US); James R. Lindle, Bowie, MD (US); Chul Soo Kim, Springfield, VA (US); Mijin Kim, Springfield, VA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/608,115

(22) Filed: Sep. 10, 2012

(65) Prior Publication Data
US 2013/0003770 A1    Jan. 3, 2013

Related U.S. Application Data (62) Division of application No. 13/023,656, filed on Feb. 9, 2011, now Pat. No. 8,290,011.

(60) Provisional application No. 61/415,898, filed on Nov. 22, 2010.

(51) Int. Cl.
*H01S 5/00* (2006.01)

(52) U.S. Cl. ......... 372/45.01; 372/8; 372/39; 372/44.01

(58) Field of Classification Search ................ 372/8, 39, 372/45.01
See application file for complete search history.

(56) References Cited

U.S. PATENT DOCUMENTS

| 5,457,709 | A | 10/1995 | Capasso et al. |
| 5,588,015 | A | 12/1996 | Yang |
| 5,793,787 | A * | 8/1998 | Meyer et al. ............... 372/45.01 |
| 5,799,026 | A * | 8/1998 | Meyer et al. ............... 372/45.01 |
| 6,404,791 | B1 | 6/2002 | Yang et al. |
| 7,282,777 | B1 | 10/2007 | Yang et al. |
| 2007/0054427 | A1 | 3/2007 | Laikhtman et al. |
| 2008/0304531 | A1 | 12/2008 | Mansour et al. |
| 2010/0097690 | A1 * | 4/2010 | Vurgaftman et al. ......... 359/344 |

OTHER PUBLICATIONS

K. Mansour et al., "Mid-infrared interband cascade lasers at thermoelectric cooler temperatures," Electronics Letters vol. 42 No. 18 (2006).
L. Shterengas et al., "Continuous wave operation of diode lasers at 3.36 μm at 12° C.," Applied Physics Letters 93, 011103 (2008).

(Continued)

*Primary Examiner* — Dung Nguyen
(74) *Attorney, Agent, or Firm* — Amy Ressing; Joslyn Barritt (57) ABSTRACT A gain medium and an interband cascade laser, having the gain medium are presented. The gain medium can have one or both of the following features: (1) the thicknesses of the one or more hole quantum wells in the hole injector region are reduced commensurate with the thickness of the active hole quantum well in the active quantum well region, so as to place the valence band maximum in the hole injector region at least about 100 meV lower than the valence band maximum in the active hole quantum well; and (2) the thickness of the last well of the electron injector region is between 85 and 110% of the thickness of the first active electron quantum well in the active gain region of the next stage of the medium. A laser incorporating a gain medium in accordance with the present invention can emit in the mid-IR range from about 2.5 to 8 μm at high temperatures with room-temperature continuous wave operation to wavelengths of at least 4.6 μm, threshold current density of about 400 A/cm$^2$ and threshold power density of about 900 W/cm$^2$.

6 Claims, 5 Drawing Sheets

OTHER PUBLICATIONS

R. Yang et al., "High-power interband cascade lasers with quantum efficiency > 450%," Electronics Letters vol. 35, No. 15, pp. 1254-1255 (1999).

R. Yang et al., "Mid-Infrared Type-II Interband Cascade Lasers," IEEE Journal of Quantum Electronics, Vol. 38, No. 6, pp. 559-568 (2002).

Search Report and Written Opinion of ISA in PCT Application No. PCT/US2009/059769.

T. Hosoda et al., "Diode lasers emitting near 3.44 μm in continuous-wave regime at 300K," Electron. Lett. 46, 1455 (2010).

Q. Y. Lu et al., Room-temperature continuous wave operation of distributed feedback quantum cascade lasers with watt-level power output, Appl. Phys. Lett. 97, 231119 (2010).

Slivken et al., "Powerful QCLs eye remote sensing," Compound Semiconductor, pp. 22-23 (2008).

R. Maulini et al., "Widely tunable high-power external cavity quantum cascade laser operating in continuous-wave at room temperature," Electronics Letters 45, 107 (2009).

D. Caffey et al., "Performance Characteristics of a Continuous Wave Compact Widely Tunable External Cavity Interband Cascade Laser," Opt. Express 18, 15691 (2010).

C. L. Canedy et al., "High-Power, Narrow-Ridge, Mid-Infrared Interband Cascade Lasers," J. Cryst. Growth 301, 931 (2007).

C. L. Canedy et al., "High-Power and High-Efficiency Midwave-Infrared Interband Cascade Lasers," Appl. Phys. Lett. 88, 161103 (2006).

* cited by examiner

INTERBAND CASCADE LASERS

CROSS-REFERENCE

This application is a divisional of and claims the benefit of priority under 35 U.S.C. §120 based on U.S. patent application Ser. No. 13/023,656 filed on Feb. 9, 2011, which in turn is a nonprovisional of and claims the benefit of priority under 35 U.S.C. §119 based on U.S. Provisional Patent Application No. 61/415,898 filed on Nov. 22, 2010, both of which are hereby incorporated by reference into the present application in their entirety.

TECHNICAL FIELD

The present invention relates to an improved interband cascade gain medium for improved laser or optical amplifier performance in the mid-infrared range at temperatures accessible with thermoelectric cooling or above.

BACKGROUND

There has been an increasing interest in the development of laser sources that emit in the mid-infrared ("mid-IR") spectral region, i.e., at wavelengths between about 2.5 and 8 µm. Such lasers have significant uses for both military and non-military applications. In the military realm, mid-IR lasers can be extremely useful as a countermeasure to jam heat-seeking missiles and prevent them from reaching their targets. In both the military and non-military realm, such mid-IR lasers have found use, for example, in chemical sensing, and so may be very useful in environmental, medical, and national security applications.

On the short-wavelength side of this spectral region, type-I quantum-well antimonide lasers are achieving excellent performance and greater maturity. See, e.g., T. Hosoda et al., "Diode lasers emitting near 3.44 µm in continuous-wave regime at 300K," *Electron. Lett.* 46, 1455 (2010). On the long-wavelength side of the mid-IR, intersubband quantum cascade lasers (QCLs) have become the dominant source of laser emissions. See, e.g., Q. Y. Lu et al., "Room-temperature continuous wave operation of distributed feedback quantum cascade lasers with watt-level power output, *Appl. Phys. Lett.* 97, 231119 (2010).

For the mid-infrared spectral region, the interband cascade laser (ICL) is being developed as a promising semiconductor coherent source.

The first ICLs were developed by Rui Yang in 1994. See U.S. Pat. No. 5,588,015 to Yang. The ICL may be viewed as a hybrid structure which resembles a conventional diode laser in that photons are generated via the radiative recombination of an electron and a hole. However, it also resembles a quantum cascade laser in that multiple stages are stacked as a staircase such that a single injected electron can produce an additional photon at each step of the staircase. See Slivken et al., "Powerful QCLs eye remote sensing," *Compound Semiconductor*, pp. 22-23 (2008); see also U.S. Pat. No. 5,457,709 to Capasso et al. Each stage is made up of an active quantum well region, a hole injector region, and an electron injector region. The photon cascade is accomplished by applying a sufficient voltage to lower each successive stage of the cascade by at least one photon energy, and allowing the electron to flow via an injector region into the next stage after it emits a photon. Outside of the active quantum well region and hole injector, current transport in the ICL typically takes place entirely via the movement of electrons, although this is not required. Therefore, two optical cladding regions are generally used at the outsides of the gain medium to confine the lasing mode along the injection axis, and n-type contacts are provided outside the cladding regions to provide for electrical bias and current injection.

ICLs also employ interband active transitions just as conventional semiconductor lasers do. Each interband active transition requires that electrons occupying states in the valence band following the photon emission be reinjected into the conduction band at a boundary with semi-metallic or near-semi-metallic overlap between the conduction and valence bands. Although type-I ICLs are also possible (see U.S. Pat. No. 5,799,026 to Meyer et al., two inventors of which are the inventors of the present invention, and which is incorporated by reference into the present disclosure), most ICLs employ active transitions that are of type-II nature, i.e., the electron and hole wavefunctions peak in adjacent electron (typically InAs) and hole (typically Ga(In)Sb) quantum wells, respectively.

In order to increase the wavefunction overlap, two InAs electron wells often are placed on both sides of the Ga(In)Sb hole well, and create a so-called "W" structure. In addition, barriers (typically Al(In)Sb) having large conduction- and valence-band offsets can surround the "W" structure in order to provide good confinement of both carrier types. See U.S. Pat. No. 5,793,787 to Meyer et al., which shares an inventor in common with the present invention and which is incorporated by reference into the present disclosure. The basic ICL structure was also improved by including more than one hole well to form a hole injector. See U.S. Pat. No. 5,799,026 to Meyer et al., supra. Other improvements are described in R. Q. Yang et al., "High-power interband cascade lasers with quantum efficiency >450%," *Electron. Lett.* 35, 1254 (1999); R. Q. Yang, et al., "Mid-Infrared Type-II Interband Cascade Lasers," *IEEE J. Quant. Electron.* 38, 559 (2002); and K. Mansour et al., "Mid-infrared interband cascade lasers at thermoelectric cooler temperatures," *Electron. Lett.* 42, 1034 (2006).

Further improvements to the ICL structure were made by the inventors of the present invention as described in U.S. Patent Application Publication No. 2010/0097690, the entirety of which is incorporated by reference into the present disclosure, and have improved laser performance in the mid-IR range at temperatures of about 250 K and above.

However, further improved performance in the mid-IR at room temperature remains a goal.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention comprises an interband cascade gain medium and an interband cascade laser or amplifier having the same.

An interband cascade gain medium in accordance with the present invention comprises a series of cascading stages, each stage comprising an active quantum well region that includes one or more alternating InAs active electron quantum wells and GaInSb active hole quantum wells; a hole injector region that includes one or more GaSb hole quantum wells; and an electron injector region including a plurality of InAs electron quantum wells.

In accordance with the present invention, such an interband cascade gain medium includes one or both of the following features: (1) the thickness of the GaSb hole quantum well(s) in the hole injector region is reduced commensurate with the thickness of the GaInSb active hole quantum well in the active quantum well region; and (2) the thickness of the last InAs well of the electron injector region is between 85 and 110% of the thickness of the first InAs active electron quantum well in the active gain region of the next stage of the medium.

A laser incorporating a gain medium in accordance with the present invention can emit in the mid-IR range from about 2.5 to 8 μm at high temperatures, and at wavelengths as long as about 4.6 μm, can achieve room-temperature continuous wave operation with threshold current density of about 400 A/cm$^2$ and threshold power density of about 900 W/cm$^2$. These improved performance characteristics are unexpected results of the design features of the present invention and stand in sharp contrast to the results predicted by the inventors based on computer models of ICL performance.

DETAILED DESCRIPTION

The present invention comprises an interband cascade gain medium and an interband cascade laser or amplifier using the same.

This invention can be embodied in various forms. The following description shows, by way of illustration, combinations and configurations in which the aspects can be practiced. It is understood that the described aspects and/or embodiments of the invention are merely examples. It is also understood that one skilled in the art may utilize other aspects and/or embodiments or make structural and functional modifications without departing from the scope of the present disclosure.

For example, although an interband cascade gain medium in accordance with the present invention is described herein as comprising semiconductor layers of specified thicknesses arranged in a specified configuration, one skilled in the art would appreciate that other layer thicknesses and configurations may also be used. Whenever an alloy composition is specified, such as $Ga_{1-x}In_xSb$, it is understood that the composition percent x may be zero, and in such a case the material will be GaSb. In addition, although the gain medium according to the present invention is described herein as comprising InAs, $Ga_{1-x}In_xSb$, GaSb, and AlSb semiconductor materials, one skilled in the art will appreciate that other semiconductor materials may be substituted.

For example, in some embodiments, a small amount of In can be introduced into some of the AlSb layers for strain compensation, and such a case is denoted as having the structure "Al(In)Sb." Alternatively, if a lower barrier is desired, one may introduce Ga into the AlSb to form Al(Ga)Sb. In other cases, a small amount of As may also be added to the Al(Ga)Sb to form Al(GaAs)Sb in order to adjust the lattice constant for lattice matching or strain compensation. A more general alloy with barrier properties playing a similar role to AlSb is Al(GaInAs)Sb.

Similarly, a small amount of Al and/or As can be introduced into the $Ga_{1-x}In_xSb$ material, and such cases are denoted as having the structure "Ga(Al)Sb," "Ga(As)Sb," and "Ga(AlAs)Sb," respectively. A more general alloy that can serve as a hole quantum well is Ga(AlInAs)Sb.

Also, in the description that follows we assume a hole injector comprising two GaSb hole quantum wells separated by AlSb barriers, where the total thickness of the two hole quantum wells is adjusted to attain an energy separation of $\Delta E \geq 100$ meV between the top valence state in the hole injector and the valence band maximum in the active hole quantum well. However, in other cases one or three Ga(In)Sb quantum wells may be used, and in those cases other variations in the configuration of the gain medium can be made so long as the energy separation of $\Delta E \geq 100$ meV is maintained.

Thus, as described in more detail below, the present invention comprises an interband cascade gain medium and an interband cascade laser or amplifier using the same.

An interband cascade gain medium in accordance with the present invention comprises a series of cascading stages, each stage comprising an active quantum well region that includes one or more alternating InAs active electron quantum wells and GaInSb active hole quantum wells; a hole injector region that includes one or more GaSb hole quantum wells; and an electron injector region including a plurality of InAs electron quantum wells.

In accordance with the present invention, such an interband cascade gain medium includes one or both of the following features: (1) the thickness of the GaSb hole quantum well(s) in the hole injector region is reduced commensurate with the thickness of the $Ga_{1-x}In_xSb$ active hole quantum well in the active quantum well region; and (2) the thickness of the last InAs well of the electron injector region is between 85 and 110% of the thickness of the first InAs active electron quantum well in the active gain region of the next stage of the medium, with the thicknesses of the two to four InAs injector QWs adjacent to the final QWs being reduced commensurately.

The present invention also can include an interband cascade laser and an external cavity laser employing a gain medium having one or more of the features described above. See K. Mansour et al., supra. See also R. Maulini et al., "Widely tunable high-power external cavity quantum cascade laser operating in continuous-wave at room temperature," *Electronics Letters* 45, 107 (2009); and D. Caffey et al., "Performance Characteristics of a Continuous Wave Compact Widely Tunable External Cavity Interband Cascade Laser," *Opt. Express* 18, 15691 (2010). An exemplary laser incorporating such a gain medium can emit in the mid-IR range from about 2.5 to 8 μm at high temperatures, and at wavelengths as long as about 4.6 μm, can achieve room-temperature continuous wave operation with threshold current density of about 400 A/cm$^2$ and threshold power density of about 900 W/cm$^2$.

Figure 3:
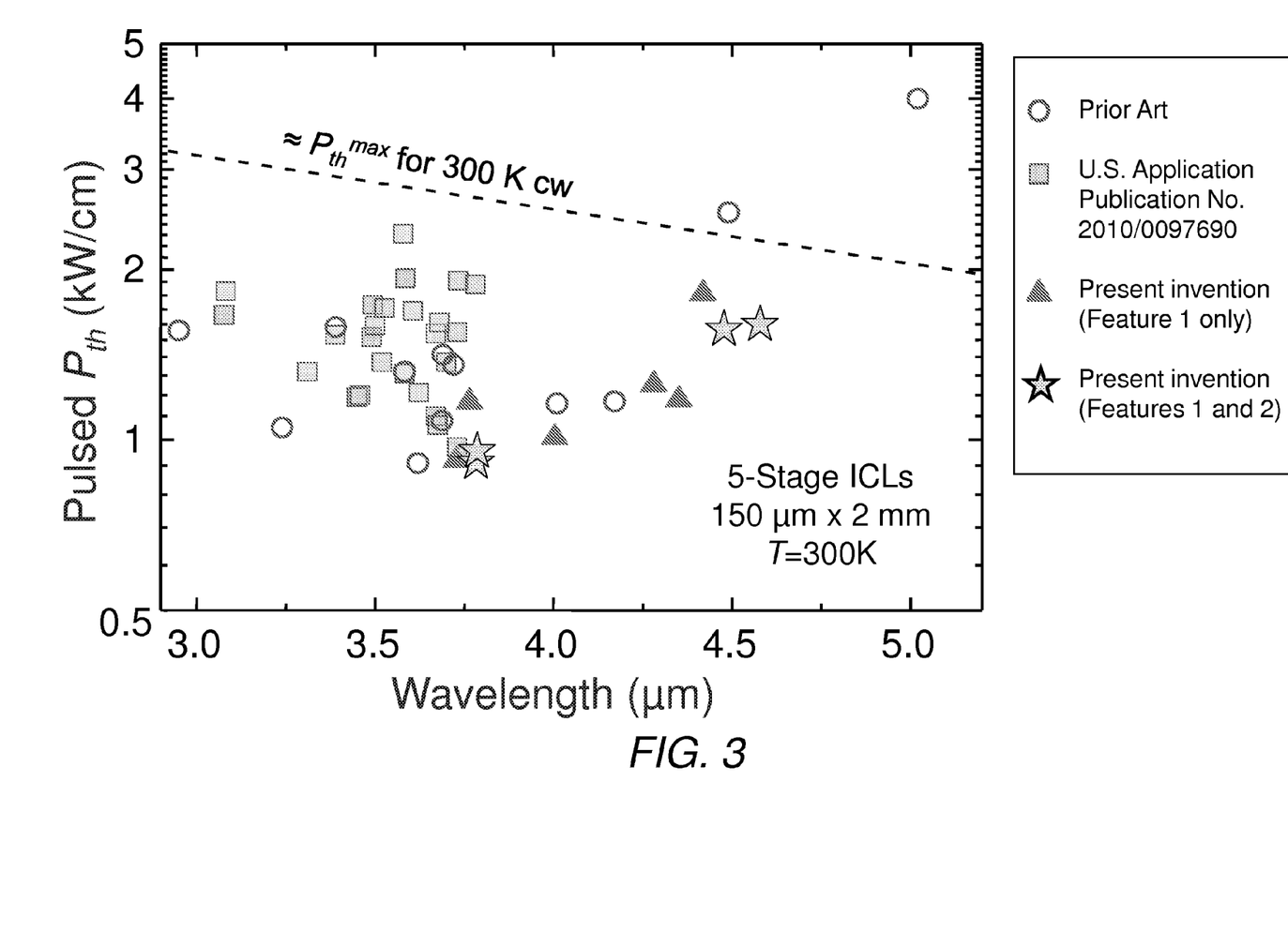
FIG. 3 depicts the threshold power densities measured for the pulsed operation of broad-area ICLs designed according to the prior art, U.S. Patent Application Publication No. 2010/0097690, and in accordance with the present invention.
Figure 4:
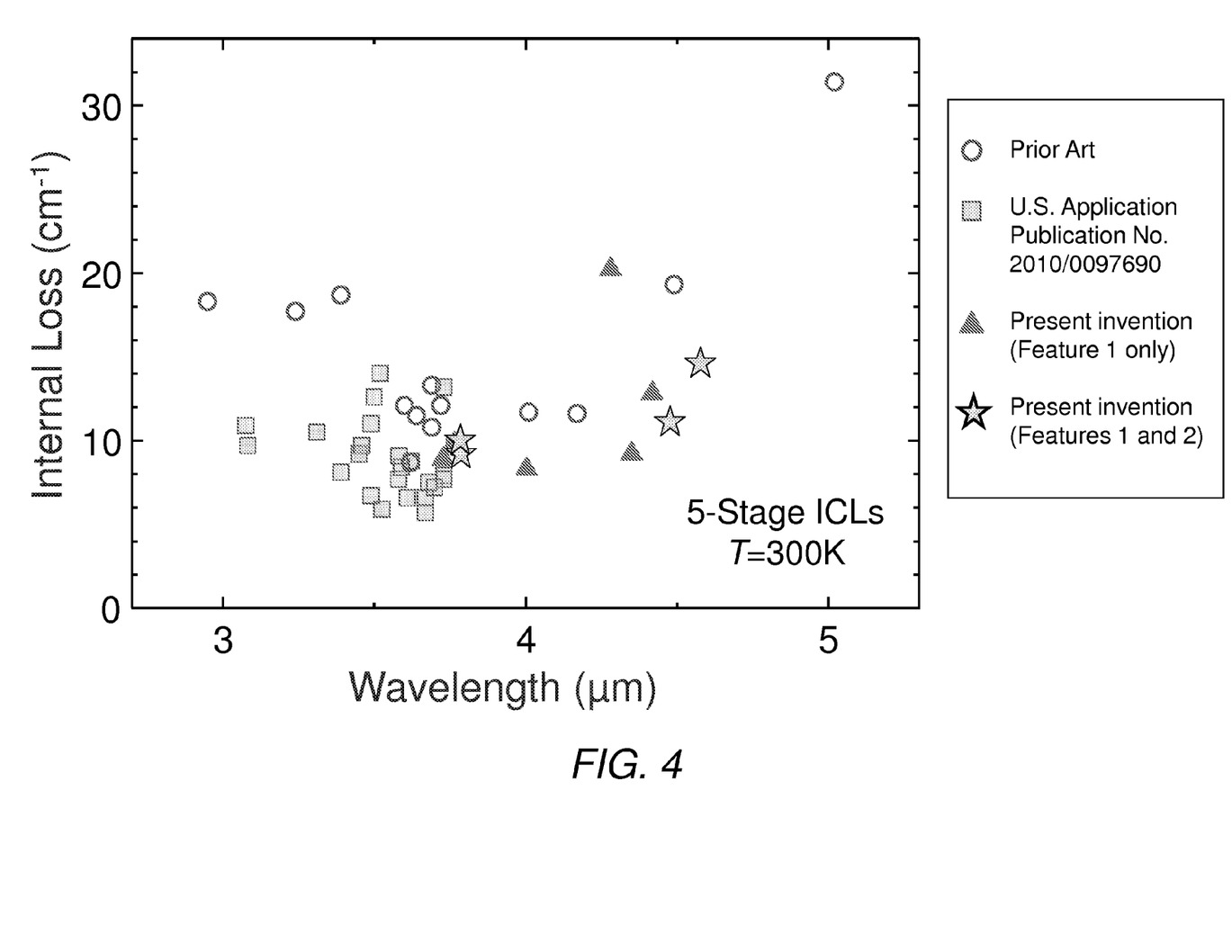
FIG. 4 depicts internal losses derived from the slope efficiencies of the same ICLs as were depicted in FIG. 3, with the same correspondence for the various symbols used in FIG. 3.

These improved performance characteristics are unexpected results of the design features of the present invention and stand in sharp contrast to the results predicted by the inventors based on computer models of ICL performance. As shown in FIGS. 3 and 4 described below, testing of 10 ICL wafers incorporating the features of the invention has confirmed that the typical threshold current densities and threshold power densities are consistently lower when compared to ICLs grown to designs not including the features of the invention. In contrast, modeling of the active region energy levels predicted that the prior art's thicker GaSb hole QW(s) in the hole injector and thicker final InAs QW of the electron injector should have provided adequate energy separation to prevent holes and electrons from accumulating in the injector regions rather than transferring to the active quantum wells. The modeling further predicted that the features of the invention should not have lowered the threshold current density, and in fact should have increased the threshold voltage so as to induce a higher rather than lower threshold power density. The performance of the gain medium in accordance with the present invention was in sharp contrast to the results that would have been expected based on these models.

Figure 1:
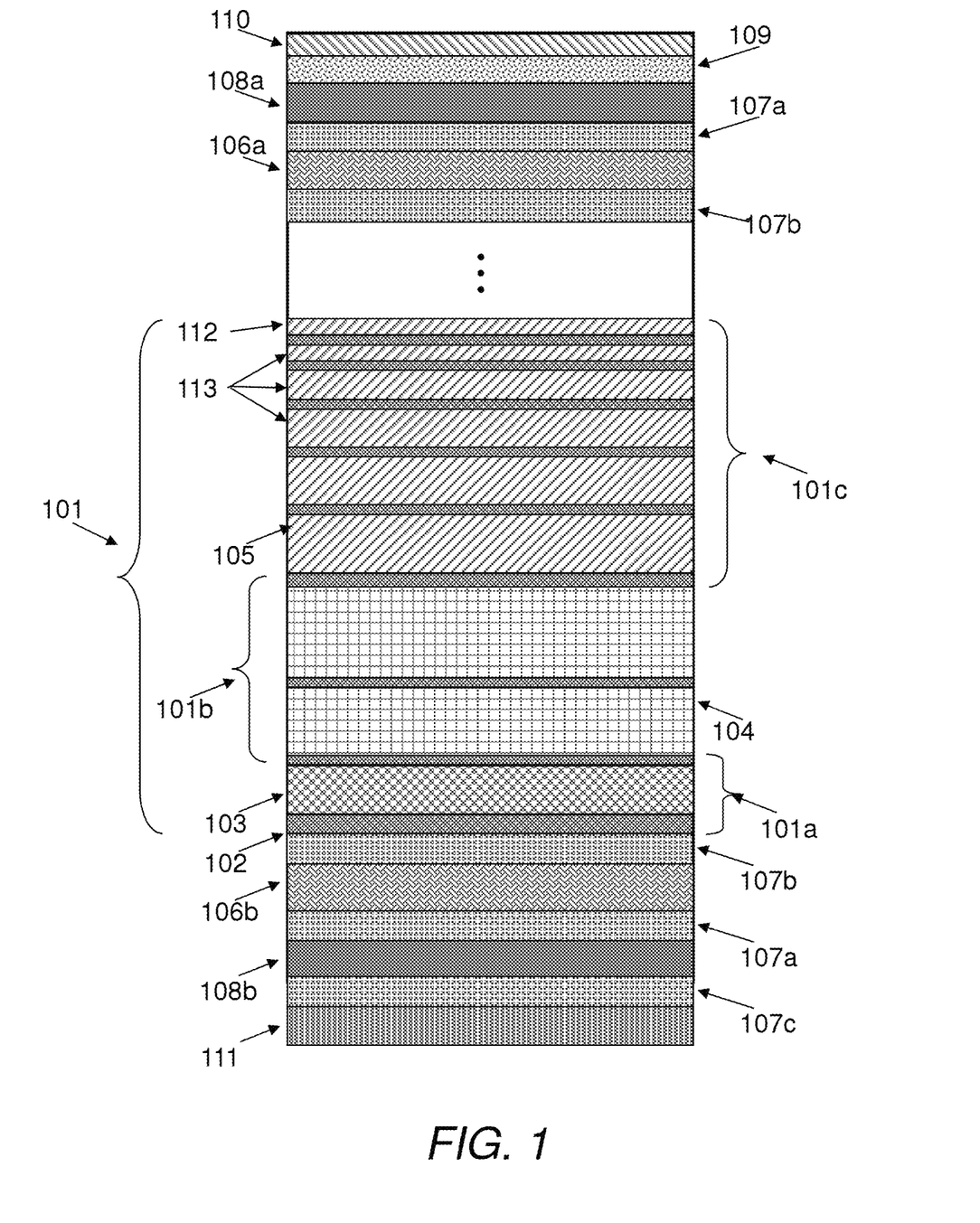
FIG. 1 is a block diagram depicting a layer structure of an exemplary interband cascade gain medium in accordance with the present invention.

A block diagram of an exemplary configuration of an interband cascade gain medium in accordance with the present invention is depicted in FIG. 1, where like-patterned areas are used to denote like or very similar materials.

As shown in FIG. 1 and as described herein, an interband cascade gain medium in accordance with the present invention can comprise a series of stacked layers of semiconductor material which can form a series of quantum barriers and wells that control the movement of electrons and holes in the medium. As shown in FIG. 1, an interband cascade gain medium in accordance with the present invention can include an active gain region comprising a series of cascaded stages, each stage 101 comprising an active quantum well (QW) region 101a, a hole injector 101b, and an electron injector 101c which contains a final InAs quantum well 112 adjacent to the active gain region and additional wells 113 adjacent to the final well. The components of the active gain region act in combination to produce electron and hole energy levels and wavefunctions which, when combined under appropriate bias and electrical injection, cause the emission of light from the medium. The individual stages 101 of the active gain region are repeated a number of times to comprise the gain medium.

The gain medium further can include separate confinement layers (SCLs) 106a and 106b which can be located at each end of the active gain region, cladding layers 108a and 108b, a substrate 111, and transition regions 107a, 107b, 107c, and 109 disposed between the various functional regions to smooth out the abrupt voltage shift in the conduction band profiles of the two adjoining regions. In some embodiments (not shown), an additional contact layer can be also disposed between substrate 111 and cladding layer 108b. In addition, an n$^+$-InAs or other suitable top contact layer 110 can be disposed at the top of the epitaxial structure.

In accordance with aspects of operation of semiconductor interband lasers known in the art, the structure of a gain medium in accordance with the present invention produces conduction and valence band energies and corresponding electron wavefunctions that govern the movement and recombination of electrons and holes in the semiconductor materials and so govern the creation and emission of photons by the laser.

Figure 2A:
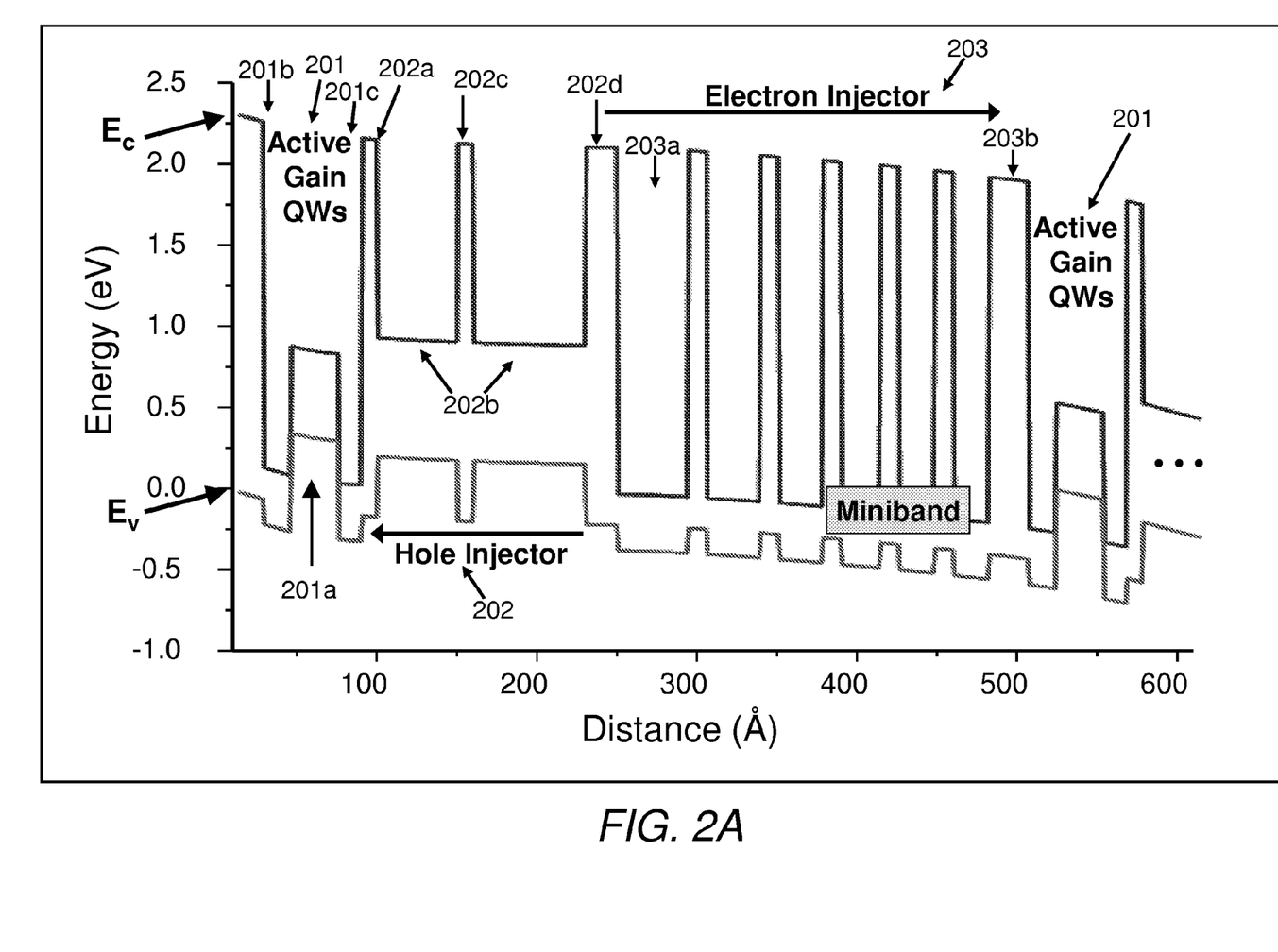
FIG. 2A depicts the conduction and valence band profiles of an exemplary active gain region of an interband cascade gain medium in accordance with the present invention.
Figure 2B:
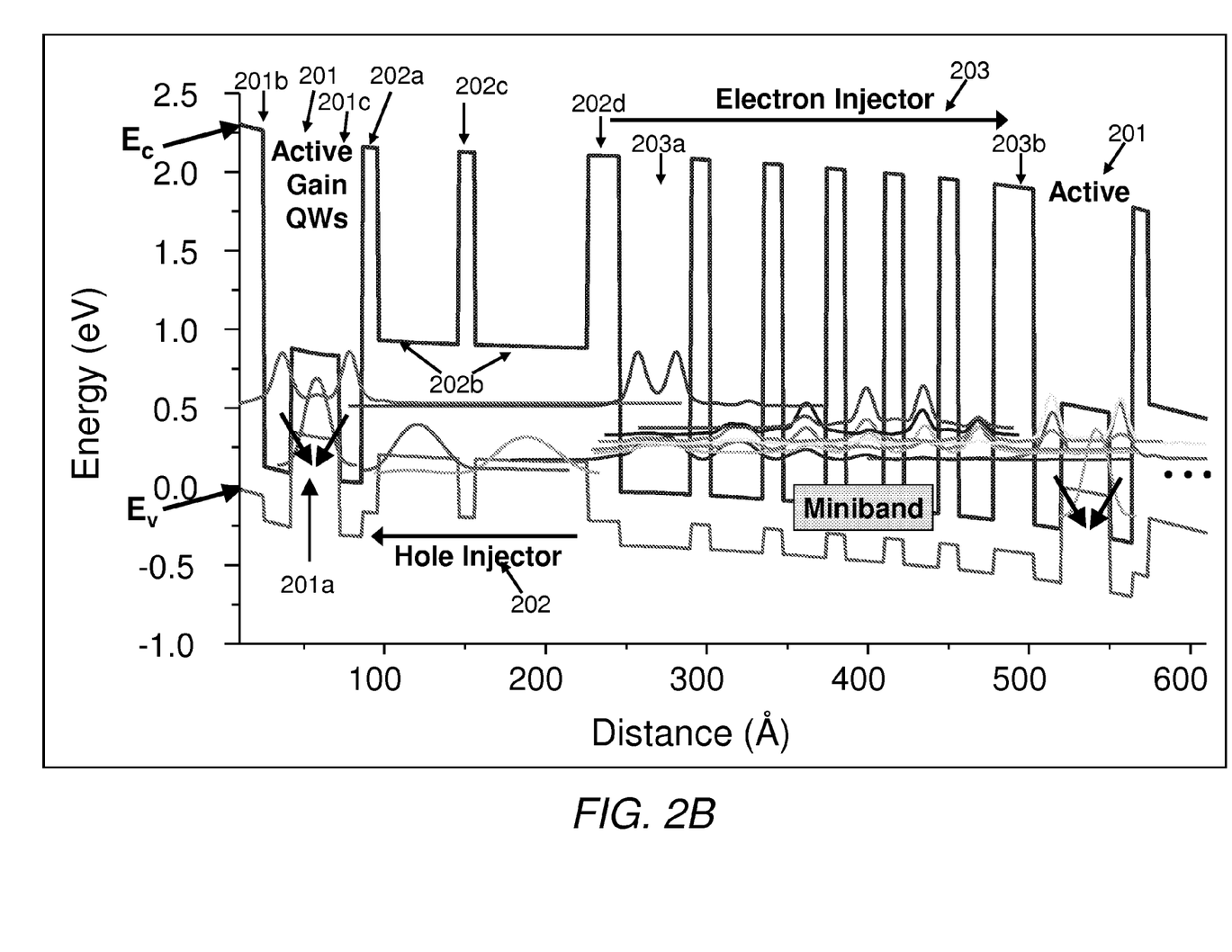
FIG. 2B depicts selected electron and hole energy levels and wavefunctions corresponding to the conduction and valence band profiles shown in FIG. 2A.

FIGS. 2A and 2B are block diagrams showing plots of the conduction band profiles ($E_c$) and valence band profiles ($E_v$) in an exemplary stage of the active gain region, along with the beginning of the next stage, of a gain medium incorporating one or more of the features described below in accordance with the present invention.

As seen in FIGS. 2A and 2B, each stage of the active gain region consists of the electron and hole active QWs 201, a hole injector 202, and an electron injector 203, with a new stage, again beginning with electron and hole active QWs 201, cascading from electron injector 203.

In accordance with principles of semiconductor interband cascade lasers known in the art, electrons injected from an electron pump source populate conduction states in the active QWs 201. In the configuration shown in FIGS. 2A and 2B, the electrons are injected from left to right, although of course other directionalities of the electron source are possible. Photons are emitted via interband optical transitions from the conduction states to the valence states in the active QWs. Once in the active QW valence band, electrons tunnel to the first (and then the second, if it is present) Ga(InAlAs)Sb QW(s) 202b of the hole injector 202. Because of the type-II energy overlap between InAs and Ga(InAlAs)Sb, the key feature that allows cascading, electrons in the Ga(InAlAs)Sb valence band elastically scatter or tunnel to conduction-band states in the relatively-thick first InAs QW 203a of the electron injector 203. Once back in the conduction band, the electrons propagate through the InAs/Al(In)Sb superlattice (SL) having progressively-decreasing QW thickness that comprises the electron injector 203 to regain energy before tunneling through a final Al(In)Sb barrier 203b into the next active QWs 201 for recycling and the emission of additional photons. The cascading of multiple stages provides multiple photons (more power) out for every electron in at the expense of a higher bias voltage required to charge all of the active gain regions simultaneously. This trade is generally advantageous, since lower current for a given output power means that parasitic ohmic and non-ohmic voltage drops become relatively less important.

In accordance with the present invention, the operation of these aspects of an interband cascade gain medium can be improved by the incorporation of one or both of features (1) and (2) described below.

Feature (1)—Thickness of GaSb hole wells in hole injector region commensurate with thickness of $Ga_{1-x}In_xSb$ active hole well.

In accordance with feature (1) of the present invention, the combined thickness of the GaSb hole wells in the hole injector is reduced considerably, from 120 Å in the prior art, see, e.g., C. L. Canedy et al., "High-Power, Narrow-Ridge, Mid-Infrared Interband Cascade Lasers," *J. Cryst. Growth* 301, 931 (2007), to a much smaller value of about 40 Å to about 85 Å commensurate with the thickness of the active GaInSb hole well in the active quantum well region.

In an interband cascade gain medium in accordance with the present invention, active QWs 201 can include a $Ga_{1-x}In_xSb$ active gain hole quantum well 201a surrounded by InAs active gain electron quantum wells 201b and 201c. As noted above, electrons and holes recombine in the active QWs 201 to produce photons. However, as is known in the art, in some cases the energy from the electron-hole pair does not produce a photon, but instead is transferred to another electron or hole in a process known as Auger recombination. Thus, one goal in laser design is to reduce the Auger recombination in order to reduce the non-radiative decay and thereby reduce the lasing threshold.

The best electron-hole wavefunction is achieved with the GaInSb hole well 201a being as thin as possible. However, this is not necessarily the optimum configuration, since the magnitude of the nonradiative Auger coefficient that controls the carrier lifetime at high temperatures is also expected to scale with the wavefunction overlap. Furthermore, theoretical considerations predict that the internal loss and the Auger coefficient may have a non-monotonic (resonant) dependence on the hole well thickness due to the changes in the positions of the lower valence subbands. Therefore, the optimum hole well thickness may be a function of the emission wavelength. Whatever the optimum hole well width, recent NRL test results show it to be important to make sure that the hole states in the GaSb wells 202b in the hole injector region are much lower than the top of the valence band so that few holes fill those wells under an applied field and electrical injection.

Thus, in accordance with feature (1) of the present invention, the GaSb hole wells 202b in the hole injector region have a thickness that is commensurate with the thickness of the active GaInSb hole well 201b in the active quantum well region so that a separation $\Delta E \geqq 100$ meV between subbands in the active gain hole quantum well and the quantum wells of the hole injector is maintained.

In accordance with this feature (1) of the present invention, the combined thickness of the GaSb hole wells in the hole injector can range from a minimum of about 40 Å to a maximum of about 85 Å, commensurate with the thickness of the active GaInSb hole well in the active quantum well region.

For example, in one exemplary embodiment of an interband cascade gain medium in accordance with the present invention, the optimum thickness of each of the two GaSb hole wells 202b is about 15-25 Å and 25-35 Å, respectively, for a total thickness of about 40 Å to about 60 Å when the active GaInSb hole well has a thickness of 20 Å. In another exemplary embodiment, the optimum thickness of each of the two GaSb hole wells is about 25-35 Å and 40-50 Å, respectively, for a total thickness of about 65-85 Å, if the active GaInSb hole well has a thickness of 30 Å

In addition, to achieve the improved performance as a result of this feature, $Ga_{1-x}In_xSb$ hole QW 201a should have a composition x that is as large as possible while still maintaining high growth quality (e.g., as characterized by morphology and x-ray linewidths). For example, the optimum thicknesses described above assume an In composition of 35% in the GaInSb active wells with 10 Å thick AlSb barriers separating them. In other embodiments having other In percentages in the $Ga_{1-x}In_xSb$ composition, the optimum thickness of the GaSb hole wells may be different so long as a separation of $\Delta E \geqq 100$ meV between the subbands in the active hole well and wells of the hole injector is maintained. The thicknesses of the two hole injector wells can also be adjusted to compensate for the applied field, so that each hole subband can to some extent occupy both hole wells.

As the In composition is reduced, the optimum well thicknesses in the hole injector will be further reduced, although this is not the preferred embodiment for the invention.

The minimum acceptable hole well thickness is set by the difficulties in the hole transport to the active region for a large $\Delta E$, a reduction in the thickness of the total barrier to electron tunneling from the active region to the electron injector, and an increase of the bias voltage required per stage.

Analysis of the ICL threshold data has shown that a gain medium having active QWs 201 with this feature in accordance with the present invention have a smaller Auger decay rate and exhibit lower current-density thresholds for lasing at higher temperatures near ambient. This appears to indicate that fewer electrons and holes are required to reach the lasing threshold, in contrast to the results that were predicted by computer models.

Feature (2)—Reduction in thickness of the final InAs well of the electron injector In an interband cascade gain medium having the active quantum well region, hole injector region, and electron injector region described above, electrons may occupy states in the electron injector rather than the active InAs wells if the width of the wells in the injector near the active region is too small.

Thus, in accordance with the present invention, the thickness of the electron wells 112 of the electron injector 101c relative to the thickness of the wells in the active quantum well region can be adjusted to achieve the desired behavior of electrons in the electron injector. In a preferred embodiment of this feature (2) of the present invention, the thickness of the final electron well 112 of the electron injector 101c should be between 85 and 110% of the thickness of the thicker active InAs well in the active quantum well region of the next stage. This runs counter to thicknesses described in the prior art, since modeling based on ideal structures had suggested that a thickness ratio of $\geqq 120\%$ should be adequate to minimize accumulation of electrons in the injector quantum wells. See, e.g., C. L. Canedy et al., "High-Power and High-Efficiency Midwave-Infrared Interband Cascade Lasers," *Appl. Phys. Lett.* 88, 161103 (2006). In addition, in order to ensure rapid and effective miniband transport through the electron injector, the thicknesses of the two to four electron quantum wells 113 adjacent to the final electron injector quantum well 112 should also be reduced commensurately. This also serves to further decrease the density of electrons accumulating in the injector rather than the active electron quantum well(s).

The thicknesses of the adjacent QWs are adjusted so as to maintain alignment between the lowest subband energy in the final QW with those in the QWs leading up to it. If the energy levels are too far out of alignment, electron transport would be inhibited and electrons could potentially accumulate in the adjacent wells even though they no longer accumulated in the final well. For the typical applied field of 100 kV/cm at threshold, the thickness of the InAs QW next to the final QW is increased by <10% relative to the final QW, whereas the thicknesses of all the other wells are increased by approximately 20-30% in comparison to the adjacent QWs on their right. This allows the first InAs QW to be maintained in the 40-50 Å range described in our previous patent application. The thickness of the first well of the electron injector is determined by the need to reach threshold carrier densities at a bias while dropping a little more than an energy gap per stage and is not affected by the above considerations.

The reduction of the thicknesses of the InAs QWs of the electron injector 101c adjacent to the active electron QWs accomplishes the objective of reducing the concentration of the electrons residing in the injector. This implies that fewer electrons need to be supplied by the application of the electric field or by electrical injection in order to achieve lasing. This is generally beneficial because of the potential reduction in the free-carrier absorption loss.

However, the concern is that as the injector electron states are moved higher in energy relative to the active state where they need to be delivered, electron transport through the injector will suffer and eventually impact the performance of the device. Our empirical iterative optimization of the ICL design demonstrates that this concern is unimportant for the injector QW thicknesses described above. This is possibly because the carrier lifetime in an interband laser such as the ICL is close to or longer than 1 ns, whereas the relevant transport times are in the ps range, so that the structure can withstand a substantial reduction in the efficiency of electron transport without observable adverse consequences.

Thus, an interband cascade gain medium in accordance with the present invention can include one or more of Features (1) and (2) described above and a laser incorporating such a gain medium will exhibit improved performance over lasers using previously developed gain media. For example, such a laser can emit in the mid-IR range from about 2.5 to 8 μm at high temperatures with room-temperature continuous wave operation to wavelengths of at least about 4.6 μm, threshold current density of about 400 A/cm$^2$ and threshold power density of about 900 W/cm$^2$.

The improved performance of an interband cascade laser (ICL) employing a gain medium having Feature (1) only or both Features (1) and (2) in accordance with the present invention is illustrated in FIGS. 3 and 4. FIG. 3 shows the power densities in kW/cm required to reach a lasing threshold at several different wavelengths for conventional ICLs according to the prior art (circles), ICLs employing a gain medium having some or all of the features described in U.S. Patent Application Publication No. 2010/0097690 (squares), ICLs employing a gain medium having Feature (1) in accordance with the present invention (triangles), and ICLs employing a gain medium having both Features (1) and (2) in accordance with the present invention (stars). As can be seen, the ICL employing a gain medium in accordance with the present invention generally required a lower power density to reach threshold than either of the other prior ICLs, especially at longer wavelengths beyond 4.2 μm.

FIG. 4 shows internal power losses that govern laser efficiency and further illustrates the improved performance of an ICL having a gain medium in accordance with Feature (1) of the present invention (triangles) or both Features (1) and (2) of the present invention (stars), with such ICLs showing lower power losses than conventional ICLs at every wavelength, and especially so at higher wavelengths beyond 4.2 μm.

The observed improvements in performance shown in FIGS. 3 and 4 were unexpected. Modeling of the active region energy levels predicted that the prior art's thicker GaSb hole QW(s) in the hole injector and thicker final InAs QW of the electron injector should have provided adequate energy separation to prevent holes and electrons from accumulating in the injector regions rather than transferring to the active quantum wells. The modeling predicted that the features of the invention should not have lowered the threshold current density, and in fact should have increased the threshold voltage so as to induce a higher rather than lower threshold power density.
Advantages and New Features:

Various advantages and new features of the invention have been specified in the description of the invention presented above. These advantages have been confirmed by the results of recent testing of lasers and laser test devices that employ the invention or selected components of it.

For example, 5-stage ICLs emitting at λ=4.3-4.6 μm at room temperature in pulsed mode displayed a reduction in the threshold current density from 729 A/cm$^2$ to 642 A/cm$^2$ upon the introduction of feature (2) and to 496 A/cm$^2$ upon the introduction of feature (1). A 5-stage ICL taking advantage of feature (1) and operating at λ=4.0 μm displayed the pulsed room-temperature threshold current density as low as 366 A/cm$^2$. These improvements in the threshold current density are expected to translate into higher cw operating temperatures and output powers.

While detailed modeling of the active, hole injector, and electron injector band structures predicts that the thicker injector QWs from the prior art should not impose a significant penalty, the experimental evidence for improved laser performance when the modifications of the invention are adopted is unambiguous. One possible explanation is that localized defects or non-uniformities in the injector and active layer thicknesses may provide more current leakage or more carrier build-up in the injector than is predicted by the modeling based on ideal structures. Reducing the thicknesses of the final electron and hole injector quantum wells could potentially reduce these unwanted effects by moving the non-ideal states farther away.

Although particular embodiments, aspects, and features have been described and illustrated, one skilled in the art would readily appreciate that the invention described herein is not limited to only those embodiments, aspects, and features but also contemplates any and all modifications within the spirit and scope of the underlying invention described and claimed herein. All such combinations and embodiments are within the scope of the present disclosure.

What is claimed is:

1. An interband cascade gain medium, comprising:
an active gain region comprising a plurality of cascading stages, each of the cascading stages including an active gain quantum well region comprising one or more active electron quantum wells and one or more active hole quantum wells, a hole injector region comprising one or more hole quantum wells, and an electron injector region comprising one or more electron quantum wells, a final electron quantum well of an electron injector region of a first stage being separated from an adjacent first active electron quantum well of an active gain quantum well region of a second stage by an electron barrier;
wherein the final electron quantum well of the electron injector region of the first stage has a thickness that is between 85 and 110% of a thickness of the adjacent first active electron quantum well of the second stage.

2. The interband cascade gain medium according to claim 1, wherein the first active electron quantum well of the second stage and the final electron quantum well of the electron injector region comprise InAs electron quantum wells.

3. The interband cascade gain medium according to claim 1, wherein the thicknesses of one or more electron quantum wells in the electron injector that are adjacent to the final electron quantum well of the electron injector are reduced so as to decrease the electron density in the electron injector and assure effective miniband transport through the electron injector.

4. A laser device including an interband cascade gain medium, the gain medium comprising:
an active gain region comprising a plurality of cascading stages, each of the cascading stages including an active gain quantum well region comprising one or more active electron quantum wells and one or more one active hole quantum wells, a hole injector region comprising one or more hole quantum wells, and an electron injector region comprising one or more electron quantum wells, a final electron quantum well of an electron injector region of a first stage being separated from an adjacent first active electron quantum well of an active gain quantum well region of a second stage by an electron barrier;
wherein the final electron quantum well of the electron injector region of the first stage has a thickness that is between 85 and 110% of a thickness of the adjacent first active electron quantum well of the second stage.

5. The laser device according to claim 4, wherein the laser device emits in the mid-IR range from about 2.5 to 8 μm at high temperatures and achieves room-temperature continuous wave operation at wavelengths as long as about 4.6 μm with threshold current density of about 400 A/cm$^2$ and threshold power density of about 900 W/cm$^2$.

6. An amplifier comprising an interband cascade gain medium, the gain medium comprising:

an active gain region comprising a plurality of cascading stages, each of the cascading stages including an active gain quantum well region comprising one or more active electron quantum wells and one or more one active hole quantum wells, a hole injector region comprising one or more hole quantum wells, and an electron injector region comprising one or more electron quantum wells, a final electron quantum well of an electron injector region of a first stage being separated from an adjacent first active electron quantum well of an active gain quantum well region of a second stage by an electron barrier;

wherein the final electron quantum well of the electron injector region of the first stage has a thickness that is between 85 and 110% of a thickness of the adjacent first active electron quantum well of the second stage.

* * * * *